(12) United States Patent
Neuman

(10) Patent No.: US 12,724,080 B2
(45) Date of Patent: Sep. 1, 2026

(54) STATE OF HEALTH MEASUREMENT FOR ELECTRIC VEHICLE BATTERY

(71) Applicant: GM GLOBAL TECHNOLOGY OPERATIONS LLC, Detroit, MI (US)

(72) Inventor: Christopher R. Neuman, Denver, CO (US)

(73) Assignee: GM Global Technology Operations LLC, Detroit, MI (US)

( * ) Notice: Subject to any disclaimer, the term of this patent is extended or adjusted under 35 U.S.C. 154(b) by 651 days.

(21) Appl. No.: 18/099,407

(22) Filed: Jan. 20, 2023

(65) Prior Publication Data

US 2024/0248147 A1 Jul. 25, 2024

(51) Int. Cl.

| | |
|---|---|
| ***G01R 31/392*** | (2019.01) |
| ***B60L 53/62*** | (2019.01) |
| ***G01R 31/382*** | (2019.01) |
| ***H02J 7/82*** | (2026.01) |
| ***H02J 7/84*** | (2026.01) |
| *B60L 58/12* | (2019.01) |
| *B60L 58/16* | (2019.01) |

(52) U.S. Cl.

CPC ............ *G01R 31/392* (2019.01); *B60L 53/62* (2019.02); *G01R 31/382* (2019.01); *H02J 7/82* (2026.01); *H02J 7/84* (2026.01); *B60L 58/12* (2019.02); *B60L 58/16* (2019.02)

(58) Field of Classification Search

CPC ...... G01R 31/392; G01R 31/382; G01R 1/02; G01R 1/0408; G01R 31/36; G01R 31/3842; G01R 31/385; G01R 31/387; G01R 31/388; B60L 53/62; B60L 58/12; B60L 58/16; H02J 7/0048; H02J 7/005

See application file for complete search history.

(56) References Cited

U.S. PATENT DOCUMENTS

| | | | | |
|---|---|---|---|---|
| 4,234,840 A * | 11/1980 | Konrad | ............ | G01R 19/16542 340/636.15 |
| 8,798,832 B2 * | 8/2014 | Kawahara | ............... | B60L 1/003 701/32.7 |
| 10,787,095 B2 * | 9/2020 | Milding | .................. | B60L 58/12 |
| 2013/0066506 A1 * | 3/2013 | Kelty | ....................... | B60K 6/46 180/65.245 |
| 2019/0294173 A1 * | 9/2019 | Szubbocsev | ......... | G05D 1/0274 |

FOREIGN PATENT DOCUMENTS

| | | | | |
|---|---|---|---|---|
| WO | WO-2011156776 A2 * | 12/2011 | .............. | B60L 55/00 |

* cited by examiner

*Primary Examiner* — Tung S Lau
(74) *Attorney, Agent, or Firm* — Quinn IP Law

(57) ABSTRACT

A method and system for estimating state of health (SOH) of a battery configured for providing electrical power to a motor for driving a vehicle. The method and system configured for measuring an enhanced SOH for the battery according to an enhanced SOH process. The enhanced SOH process including maximizing a discharge depth of the battery to maximize accuracy of the enhanced SOH measurement.

20 Claims, 2 Drawing Sheets

STATE OF HEALTH MEASUREMENT FOR ELECTRIC VEHICLE BATTERY

INTRODUCTION

The present disclosure relates to measuring state of health (SOH) of a battery, such as but not necessarily limited to measuring SOH for a battery configured for providing electrical power to a motor for purposes of driving a vehicle.

The SOH of a battery may be measured based on a number of factors and values, with the corresponding computations generally aimed at measuring a capability of the battery to provide electrical power relative to a design or maximum capability of the battery, i.e., a current, overall condition of the battery, including its capacity, performance, and durability. After a time of manufacture or first use, the health of a battery may diminish over time for any number of reasons, with the related degradation typically resulting in a current SOH of the battery, e.g., the overall capability of the battery to provide electrical power, being less than a rated or designed SOH of the battery occurring at the time of manufacture or first use. A device employing a battery, such as but not necessarily limited to an electric vehicle, may periodically measure a SOH of the battery to facilitate managing, controlling, or otherwise directing operations associated therewith. The SOH of the battery may be relevant to making assessments as to range, performance, and other operational capabilities.

In the case of electric vehicles, the SOH may be measured based on calculations and values taken for the battery before, after, and/or while the vehicle is being driven, such as according to current, voltage, resistance, pressure, power, and/or other readings taken while the battery is being charged or discharged. The accuracy of the corresponding measurements, i.e., the amount of error therein, may be influenced by a depth of the charge and/or discharge of the battery. The amount of error or accuracy in the measured SOH, accordingly, may be proportional to the depth of charge and/or discharge, with greater accuracy and less error generally occurring when the measurements are taken in response to greater depths of charge and discharge.

SUMMARY

One non-limiting aspect of the present disclosure relates to methods and systems for estimating SOH of a battery, such as but not necessarily limited to measuring SOH for a battery of the type configured for providing electrical power to a motor for use in driving a vehicle. The methods and systems may be configured for measuring an enhanced SOH for the battery according to an enhanced SOH process whereby a discharge depth of the battery is controlled to maximize accuracy of the enhanced SOH measurement, optionally by discharging the battery beyond a discharge depth normally used to measure a driving SOH.

One non-limiting aspect of the present disclosure relates to a method for estimating state of health (SOH) of a battery configured for providing electrical power to a motor for use in driving a vehicle. The method may include estimating an enhanced SOH for the battery according to an enhanced SOH process, with the enhanced SOH process optionally including: determining an enhanced discharging of the battery to a minimum SOC, optionally with the enhanced discharging resulting from the battery discharging electrical power to a charging station offboard the vehicle; determining an enhanced charging of the battery from the minimum SOC to a maximum SOC, optionally with the enhanced charging resulting from the charging station providing electrical power to the battery; determining an enhanced charge depth to represent an amount of electrical power provided from the charging station to charge the battery from the minimum SOC to the maximum SOC; and determining the enhanced SOH based on the enhanced charge depth.

The method may further include estimating a driving SOH for the battery according to a driving SOH process, with the driving SOH process optionally including: determining a normal discharging of the battery from a normal state of charge (SOC) to a driven SOC, optionally with the normal discharging resulting from the battery discharging electrical power to the motor as part of a driving operation; determining a normal charging of the battery from the driven SOC to the normal SOC, optionally with the normal charging resulting from the charging station providing electrical power to the battery; determining a normal charge depth to represent an amount of electrical power provided from the charging station to charge the battery from the driven SOC to the normal SOC; and determining the driving SOH based on the normal charge depth.

The method may further include the driven SOC being greater than the normal SOC and/or the normal SOC being less than the maximum SOC such that the enhanced charge depth provides a greater charge depth for the battery than the normal charge depth.

The method may further include determining a first range for the vehicle according to the driving SOH, optionally with the first range representing a first distance the vehicle is capable of driving when the battery is charged to the normal SOC, and determining a second range for the vehicle according to the enhanced SOH, optionally the second range representing a second distance the vehicle is capable of driving when the battery is charged to the normal SOC. The method may further include selecting the second range to be used instead of the first range in calculating a driving range to be communicated to an operator of the vehicle due to the enhanced SOH process being more accurate than the normal SOC process as result of the enhanced charge depth providing the greater charge depth for the battery than the normal charge depth.

The method may further include determining the normal SOC, the driven SOC, the minimum SOC, and the maximum SOC with a battery module, the battery module configured for interacting with the charging station to control charging and discharging of electrical power to and from the battery.

The method may further include the battery module determining the normal SOC, the minimum SOC, and the maximum SOC from inputs made thereto through as user interface configured for interfacing with an operator of the vehicle.

The method may further include the battery module determining the normal SOC, the minimum SOC, and the maximum SOC from inputs made thereto through an interface configured for interfacing with a back office device or a controller offboard the vehicle.

The method may further include the battery module determining the normal SOC based a prior SOH determined for the battery before the driving SOH and determining the minimum SOC and the maximum SOC based on the driving SOH.

The method may further include determining the normal SOC to be greater than the minimum SOC, determining the driven SOC to be equal to or greater than the minimum SOC, and determining the maximum SOC to be equal to or greater than the normal SOC.

The method may further include preventing the battery from discharging beyond the minimum SOC while performing the driving operation and preventing the battery from charging beyond the normal SOC as part of the driving SOH process.

The method may further include discharging the battery beyond the driven SOC to the minimum SOC as part of the enhance SOH process and charging the battery beyond the normal SOC to the maximum SOC as part of the enhance SOH process.

The method may further include determining the driving SOH and the enhanced SOH with a SOH module, optionally with the SOH module configured for processing the normal and enhanced charge depths according to an SOH equation to determine the driving SOH and the enhanced SOH.

The method may further include performing a scheduling process as part of the enhanced SOH process, with the scheduling process optionally including estimating an amount of time needed for the enhanced charging and the enhanced discharging and scheduling the enhanced SOH process according to the amount of time.

The method may further include transmitting a request message to an owner of the vehicle or the charging station to identify a desired time of day for scheduling commencement of the enhanced SOH process, optionally with the request message including information representing the amount of time.

The method may further include determining a pecuniary gain for discharging electrical power from the battery to the charging station, determining a pecuniary cost for providing electrical power from the charging station to the battery, and scheduling the enhanced SOH process according to the amount of time, the pecuniary gain, and the pecuniary cost.

One non-limiting aspect of the present disclosure relates to a method for estimating state of health (SOH) of a battery configured for providing electrical power to a motor for use in driving a vehicle. The method may include estimating a driving SOH for the battery according to a driving SOH process, the driving SOH process optionally including: determining a normal charging of the battery resulting from a charging station offboard the vehicle providing electrical power for charging the battery to a normal state of charge (SOC); determining a driving discharging of the battery resulting from the battery discharging electrical power to the motor as part of a driving operation, optionally with the driving discharging resulting in the battery discharging from the normal SOC to a driven SOC; determining a normal recharging of the battery resulting from the charging station providing electrical power for charging the battery from the driven SOC to the normal SOC; determining a normal charge depth to represent a first amount of electrical power provided from the charging station to charge the battery from the driven SOC to the normal SOC; and determining the driving SOH based on the normal charge depth. The method may further include estimating an enhanced SOH for the battery according to an enhanced SOH process, with the enhanced SOH process optionally including: determining an enhanced discharging of the battery resulting from the battery discharging electrical power to the charging station until a minimum SOC; determining an enhanced recharging of the battery resulting from the charging station providing electrical power for charging the battery from the minimum SOC to a maximum SOC; determining an enhanced charge depth to represent a second amount of electrical power provided from the charging station to charge the battery from the minimum SOC to the maximum SOC; and determining the enhanced SOH based on the enhanced charge depth. The method may still further include the normal charge depth being less than the enhanced charge depth such that the enhanced SOH process has a greater charge depth than the driving SOH process.

The method may further include determining a range of the vehicle with a range module, optionally with the range module configured for determining the range according to the enhanced SOH due to the greater charge depth of the enhanced SOH process providing a more accurate calculation of the range than the driving SOH.

The method may further include determining the driving SOH and the enhanced SOH with a SOH module, optionally with the SOH module configured for processing the normal and enhanced charge depths according to an SOH equation to determine the driving SOH and the enhanced SOH.

One non-limiting aspect of the present disclosure relates to a system for estimating state of health (SOH) of a battery configured for providing electrical power to a motor for use in driving a vehicle. The system may include a discharging module configured for determining an enhanced discharging of the battery resulting from the battery discharging electrical power to a charging station until reaching an enhanced minimum SOC, optionally with the enhanced minimum SOC being greater than a driving minimum SOC used to represent a maximum discharge permitted for the battery when discharging electrical power to the motor in performance of a driving operation. The system may further include a charging module configured for determining an enhanced charging of the battery resulting from the charging station providing electrical power for charging the battery from the enhanced minimum SOC to an enhanced maximum SOC, optionally with the enhanced maximum SOC being greater than a driving maximum SOC used to represent a maximum charge permitted for the battery in performance of the driving operation. The system may still further include a SOH module configured for determining a charge depth to represent an amount of electrical power provided from the charging station to charge the battery from the enhanced minimum SOC to the enhanced maximum SOC and determining the SOH based thereon.

The may include the SOH module configured for determining a range for the vehicle according to the SOH, optionally with the range representing a distance the vehicle is capable of driving when the battery is charged to the driving maximum SOC These features and advantages, along with other features and advantages of the present teachings, are readily apparent from the following detailed description of the modes for carrying out the present teachings when taken in connection with the accompanying drawings. It should be understood that even though the following figures and embodiments may be separately described, single features thereof may be combined to additional embodiments.

BRIEF DESCRIPTION OF THE DRAWINGS

The accompanying drawings, which are incorporated into and constitute a part of this specification, illustrate implementations of the disclosure and together with the description, serve to explain the principles of the disclosure.

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
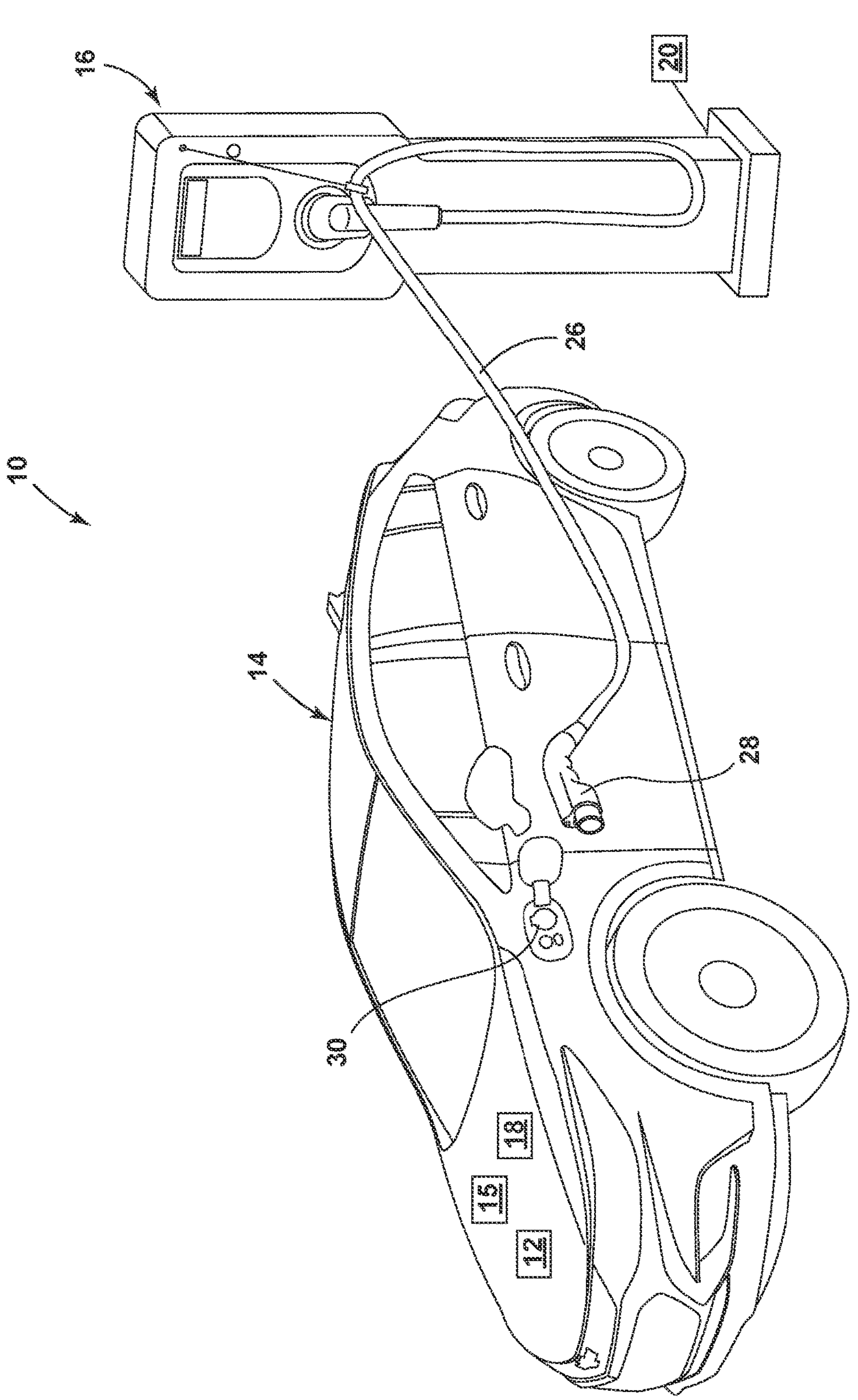
FIG. 1 illustrates a system for measuring SOH of a battery in accordance with one non-limiting aspect of the present disclosure.

FIG. 1 illustrates a system 10 for measuring SOH of a battery 12 in accordance with one non-limiting aspect of the present disclosure. The system 10 is predominantly described for exemplary and non-limiting purposes with respect to the battery 12 being configured for inclusion within a vehicle 14, such as but not necessarily limited to an electric vehicle or other type of vehicle having a motor 15 or other element operationally dependent on electrical power therefrom. The present disclosure, nonetheless, fully contemplates its use and application in measuring or otherwise estimating, calculating, or assessing SOH for the battery 12 while employed in operation with other types of devices, including devices operating in differing environments and for other purposes than those associated with the vehicle 14. The battery 12 may include a plurality of battery cells or other features capable of repeatedly storing and supplying electrical power to and from a power bus or other communication medium (not shown). The battery 12 may be included as part of a rechargeable energy storage system (RESS) operable for selectively and controllably providing electrical power to and from the battery 12, which is shown for non-limiting purposes with respect to exchanging electrical power with the motor 15 and/or a charging station 16.

The vehicle 14 may include a battery module 18 configured for managing operations of the battery 12. The battery module 18 may include or be associated with one or more of a discharging module, a charging module, a SOH module, a state of charge (SOC) module, and a range module, which may be collectively and individually references as the battery module 18. The corresponding modules 18 may be part of the same entity or associated with different controllers, software, or other features configured for facilitating the operations and processes contemplated herein. The modules 18 may optionally operate according to a corresponding plurality of non-transitory instructions stored on a computer readable storage medium, such as in response to the execution thereof with a processor. The modules 18 may be considered as functional or logical portions of the battery 12 module that may be configured in accordance with the present disclosure to facilitate measuring the SOH of the battery 12 and/or for providing information related to thereto for use in generating related information. The modules 18 are described as being included onboard the vehicle 14 for non-limiting purposes as the present disclosure fully contemplates the modules 18 and/or the operations and functions associated therewith being performed offboard the vehicle 14, such as at a remote back office (not shown) and/or the charging station 16.

The charging station 16 is shown for non-limiting purposes to correspond with a pedestal type of charging station capable of supplying electrical power to and receiving electrical power from the battery 12. The charging station 16 may correspondingly exchange electrical power with a utility or home power grid 20 associated therewith. The charging station 16 may alternatively be configured as a wall-mounted charging station 16 included with garage or location frequented by the vehicle 14 and/or as another type of device, such as charging system onboard another vehicle 14, a battery bank, etc. The vehicle 14 may optionally include an onboard target module (OBCM) (not shown) or other charger configured for delivering, inverting, and/or otherwise processing alternating current (AC) and/or direct current (DC) for use in charging and discharging of the battery 12 with the charging station 16 and/or the motor 15. The method by which electrical power may be exchanged between the charging station 16 and the battery 12 may vary depending on the configuration of the charging station 16, which is shown for non-limiting purposes to correspond with the charging station 16 including a charging cord 26 having a plug 28 configured for receipt within a charge receptacle 30 of the vehicle 14. The present disclosure fully contemplates non-wired methods for exchange electrical power, such as through inductive or wireless processes.

Figure 2:
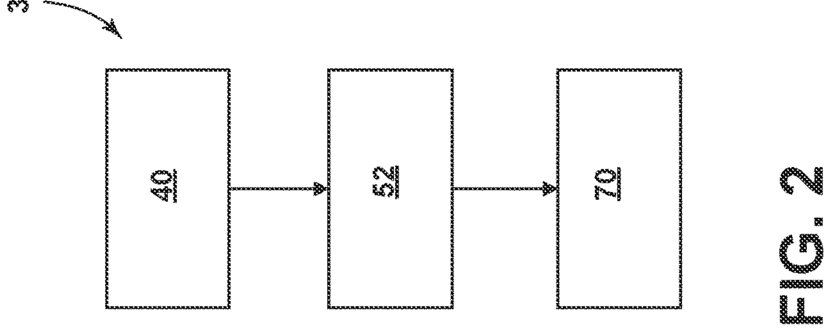
FIG. 2 illustrates a flowchart of a method for measuring SOH of the battery in accordance with one non-limiting aspect of the present disclosure.

FIG. 2 illustrates a flowchart 38 of a method for estimating SOH of the battery 12 in accordance with one non-limiting aspect of the present disclosure. The SOH module 18, optionally in cooperation with the other modules 16, may be configured to facilitate the described process for measuring the SOH of the battery 12. Block 40 relates to implementing a driving SOH process. The driving SOH process may relate to the battery 12 module calculating a driving SOH for the battery 12 to measure battery SOH after the vehicle 14 has completed a driving operation, i.e., to update a previously calculated SOH to account for the driving operation. The driving SOH process may occur after each driving operation or periodically according to a schedule. The driving operation may correspond with a typical operation of the vehicle 14 whereby electrical power may be discharged from the battery 12 to the motor 15 and thereafter converted for use in providing mechanical power to a drivetrain (not shown) or other device operable for driving the vehicle 14 from one location to one or more additional locations. The driving operation, for example, may correspond with the vehicle 14 being driven from a home of the operator to a destination and thereafter back to the home.

Figure 3:
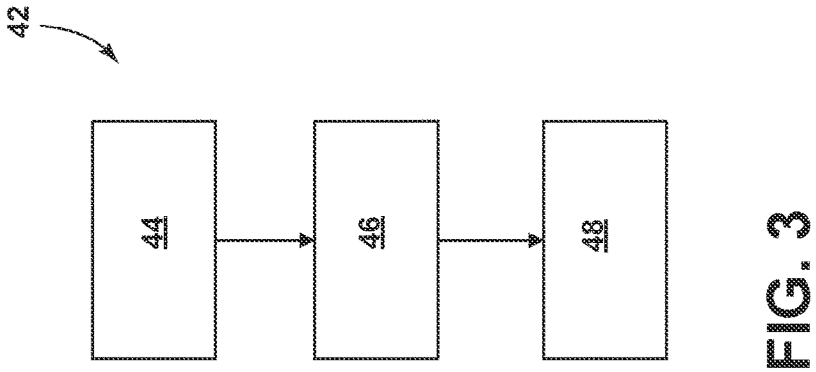
FIG. 3 illustrates a flowchart of a driving SOH process in accordance with one non-lifting aspect of the present disclosure.

FIG. 3 illustrates a flowchart 42 of the driving SOH process in accordance with one non-limiting aspect of the present disclosure. Block 44 may relate to determining a normal discharging of the battery 12 resulting from the battery 12 providing electrical power as part of a driving operation. Assuming the battery 12 was previously charged to a normal SOC, the normal discharging may result in battery discharging from the normal SOC to a driven SOC. The driven SOC may correspond with an SOC of the battery 12 at the conclusion of the driving operation, such as an SOC of the battery 12 after the vehicle 14 has been driven and returned to the home of the operator for charging. As one skilled in the art will appreciate, the SOC of the battery 12 may represent an amount of energy or electrical power stored in the battery 12 at a particularly point in time. The SOC may be expressed as a percentage of a maximum capacity of the battery 12 at the corresponding point in time. The total or maximum capacity of the battery 12 after a time of manufacture or first use may diminish over time for a number of reasons, with the related degradation typically resulting in the maximum capacity decreasing slightly over time. The capacity of the battery 12 may be measured according to kilowatt-hour (kWh), ampere or amp hour (Ah), etc.

Block 46 may relate to determining a normal charging of the battery 12 resulting from the driven SOC back to the normal SOC. The normal SOC may correspond with the capacity of the battery 12 as typically charged prior to undertaking the driving operation. The normal SOC, as such, may correspond with a normal SOC value determined by the SOC module, which may be a selectable design parameter. The SOC module 16 may be configured, for example, to determine the normal SOC value according to SOC inputs provided directly thereto and/or through the battery module 18, such as in response to the operator interfacing with a user interface (not shown) onboard the vehicle 14 and/or in response to inputs made through an interface (not shown) configured for interfacing with the back office or other device offboard of the vehicle 14. In addition to the SOC inputs, the SOC module 18 may be configured to calculate the normal SOC based on values taken for the battery 12 before, after, and/or while the vehicle 14 is being driven, such as according to current, voltage, resistance, pressure, power, and/or other readings taken while the battery 12 is being charged or discharged. The normal SOC may be equal to or less than a maximum SOC of the battery 12.

The normal SOC may correspond with a design parameter for desired operating limits for the battery 12 such that the normal SOC may be selected to be less than 100 percent of a maximum SOC, i.e., less than the current maximum capacity of the battery 12. The normal SOC, i.e., the percentage of the capacity that the battery 12 is charged to normally or prior to a driving operation, may be selected to be less than 100 percent as operating the battery 12, as a less than 100 percent SOC may improve its longevity and long-term performance. The normal SOC may nonetheless be chosen to be 100 percent SOC in other circumstances, such as in the event greater performance may be desired. For exemplary and non-limiting purposes, the normal SOC may correspond with a typical SOC generally used to facilitate charging the battery 12 in anticipation of normal driving operations. The normal charging determination, accordingly, may correspond with charging the battery 12 from the driven SOC, or other SOC resulting from a prior discharging event, to the normal SOC in anticipation of future driving operations or other activities of the vehicle 14.

Block 48 relates to determining a normal charge depth to represent an amount of electrical power provided from the charging station 16 to charge the battery 12 from the driven SOC to the normal SOC, and based thereon, determining the driving SOH. As one skilled in the art will appreciate, a SOH of the battery 12, i.e., the overall capability of the battery 12 to provide electrical power, including its capacity, performance, and durability, may slightly decrease overtime, with a current SOH of the battery 12 typically being less than a rated or designed SOH of the battery 12 occurring at the time of manufacture or first use. It may be desired for a system onboard the vehicle 14 to periodically determine a SOH of the battery 12 for purposes of managing, controlling, or otherwise directing operations associated therewith. The SOH of the battery 12 may be relevant to making assessments as to range, performance, and other operational capabilities. The driving SOH, accordingly, may be measured to determine the SOH of the battery 12 at the conclusion of the driving leading to the charging in Block 46. The driving SOH may be measured based on calculations and values taken for the battery 12 before, after, and/or while the vehicle 14 is being driven, such as according to current, voltage, resistance, pressure, power, and/or other readings taken while the battery 12 is being charged or discharged. The battery module 18 may include a SOH equation, algorithm, or other process may be configured to calculate the driving SOH based on the normal charge depth or a value representative thereof.

Returning to FIG. 2, Block 52 relates to implementing an enhanced SOH process. The enhanced SOH process may relate to the battery 12 module calculating an enhanced SOH for the battery 12, which may be contrasted with the driving SOH, as described below in more detail, due to the corresponding SOH measurement being determined as a result of the battery 12 discharging to the charging station 16 instead of the motor 15 or other system onboard the vehicle 14. The discharging of the battery 12 to the charging station 16 may be beneficial in closely monitoring electrical power being exchanged with the battery 12 and in a manner that may also enable the corresponding power to be recycled or used for pecuniary gain. The electric power discharged to the charging station 16 as part of the enhanced SOH process, for example, may be provided to the charging station 16 for use in powering a home of the vehicle's operator, for charging another vehicle, and/or for distribution to the electrical grid 20. The battery 12 module may be configured to interact with the charging station 16 to facilitate the charging and discharging associated with the enhanced SOH process.

Figure 4:
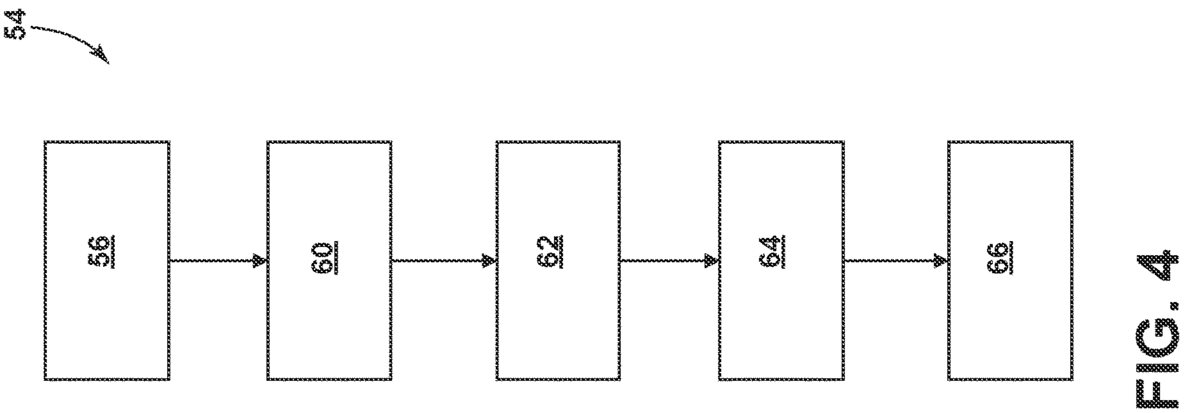
FIG. 4 illustrates a flowchart of a enhanced SOH process in accordance with one non-lifting aspect of the present disclosure.

FIG. 4 illustrates a flowchart 54 of the enhanced SOH process in accordance with one non-lifting aspect of the present disclosure. Block 56 relates to determining an enhanced discharging of the battery 12 to a minimum SOC. The enhanced discharging may result from the battery 12 discharging electrical power to the charging station 16 until reaching the minimum SOC. The discharge of electrical power to the charging station 16 may be preferable over discharging to other systems onboard the vehicle 14 as the corresponding discharging and subsequent charging may be part of a normal charging cycle process such that the enhanced SOC process may be transparent or unknown to the operator and/or discharging to the charging station 16 may avoid having to discharge systems on the vehicle 14 to consume the electrical power, i.e., it may be disconcerting to the operator for a vehicle system discharging electrical power to keep running and/or it may be wasteful. While the present disclosure contemplates discharging to the charging station 16 being more beneficial, it fully contemplates the discharging occurring within the vehicle 14 or elsewhere.

The minimum SOC may correspond with a maximum that the battery 12 may be discharged or a maximum desirable level of discharge for the battery 12. The SOC may be a selectable parameter, such as one selected according to the SOC inputs to the battery 12 module, and/or calculated according to a previous SOH for the battery 12, e.g., the minimum SOC may vary depending on a current SOH of the battery 12. The minimum SOC may be contrasted with the driven SOC in that the minimum SOC may characterize the maximum amount of electrical power the charging station 16 may be permitted to extract from the battery 12 whereas the driven SOC may characterize the amount of electrical power the motor 15 extracted from the battery 12 as part of the driving operation. The driven SOC may vary depending on the driving operation such that the driven SOC may be higher or lower depending on a rise or severity of the rising operation. The battery module 16 or other controller on board vehicle 14 may be configured to provide an SOC offset or guardband to prevent discharging the battery 12 to the minimum SOC during the driving operation. The driving operation, in other words, may be permitted until the battery SOC reaches the SOC corresponding with the guardband, which may be greater than the minimum SOC. The present disclosure, however, fully contemplates the battery 12 discharging to the minimum SOC as part of the of the driving operation.

Block 60 relates to determining an enhanced charging of the battery 12 from the minimum SOC to the maximum SOC. The enhanced charging may result from the charging station 16 providing electrical power to the battery 12 until reaching the maximum SOC following discharge to the minimum SOC, which for non-limiting purposes is described as occurring in response to electrical power being provided to the charging station 16. The maximum SOC may correspond with a maximum that the battery 12 may be charged or a maximum desirable level of charge for the battery 12. The maximum SOC may be a selectable parameter, such as one selected according to the SOC inputs to the battery 12 module, and/or calculated according to the driven or another SOH for the battery 12, e.g., the maximum SOC may vary depending on a current SOH of the battery 12. The maximum SOC may be contrasted with the normal SOC in that the maximum SOC may characterize the maximum amount of electrical power the charging station 16 may be permitted to provide to the battery 12 whereas the normal SOC may characterize a lesser amount of electrical power provided to the battery 12 in anticipation of the driving operation.

Block 62 relates to determining an enhanced charge depth to represent an amount of electrical power provided from the charging station 16 to charge the battery 12 from the minimum SOC to the maximum SOC, and based thereon, determining the enhanced SOH. The battery module 18 may utilizing the same SOH equation, algorithm, or other process of Block 48 to similarly calculate the enhanced SOH based on the enhanced charge depth or a value representative thereof, i.e., the enhanced charge depth may be used to calculate the SOH instead of the normal charge depth. As one skilled in the art will appreciated, the accuracy of SOH calculations, measurements, etc., i.e., the amount of error therein, may be influenced by a depth of the charge and/or discharge of the battery 12. The amount of error or accuracy in the measured SOH, accordingly, may be proportional to the depth of charge and/or discharge, with greater accuracy and less error generally occurring when the measurements are taken in response to greater depths of charge. One non-limiting aspect of the present disclosure contemplates the enhanced SOH process controlling battery discharging and charging so as to maximize a corresponding depth of charge, which may optionally produce a greater depth of charge than the driving SOH process, and as a result, provide a more accurate SOH measurement.

The minimum and maximum SOCs used as part of the enhanced SOH process may be outside of the driven SOC, maximum allowable driven SOC, and the normal SOC to ensure a greater charge depth. In the event the normal SOC and driven SOC are selected to match or are otherwise controllable to equal the maximum and minimum SOCs, the enhanced SOH process may be distinguished from the driving SOH process due to the enhanced controllability of discharging the battery 12 to the charging station 16 instead of the motor 15. It may be unlikely for the battery 12 to reach the minimum SOC as part of the driving SOH process due to an improbability of the battery 12 discharging to the minimum SOC while still retaining sufficient capabilities for powering the motor 15 to drive the vehicle 14 to the charging station 16 for recharging. In order to insure the vehicle 14 includes sufficient electrical power to reach a desired destination or return home, the driven SOC may be selected to be greater than the minimum SOC, and optionally to promote longevity, the normal SOC may be selected to be less than the maximum SOC.

Block 64 illustrates a scheduling process that may optionally be included as part of the enhanced SOC process. The scheduling process may include estimating an amount of time needed for the enhanced charging and the enhanced discharging and scheduling the enhanced SOH process according to the amount of time. The scheduling process may include transmitting a request message to an owner of the vehicle 14 or the charging station 16 to identify a desired time of day for scheduling commencement of the enhanced SOH process, optionally with the request message including information representing the amount of time needed for the enhanced discharge depth. The scheduling process may additionally include determining a pecuniary gain for discharging electrical power from the battery 12 to the charging station 16, determining a pecuniary cost for providing electrical power from the charging station 16 to the battery 12, and scheduling the enhanced SOH process according to the amount of time, the pecuniary gain, and the pecuniary cost.

Block 66 relates to a preparation process that may optionally be included as part of the enhanced SOC process. The preparation process may correspond with preparing the vehicle 14 in anticipation of a new driving event expected to occur after charging the battery 12 to the maximum SOC. The preparation process may include discharging the battery 12 from the maximum SOC to the normal SOC in the event the normal SOC is selected to be less than the maximum SOC. The preparation process may include discharging the battery 12 to the charging station 16 to recycle the electrical power and/or to recoup additional pecuniary gains. The preparation process may also include discharging the battery 12 so as to return the battery 12 the normal SOC in order to maintain operational consistency.

Returning to FIG. 2, Block 70 relates to implementing a recalibration process according to enhanced SOH. The recalibration process may correspond with the battery 12 module or other modules within the vehicle 14 updating parameters, values, etc. according to the enhanced SOH. The enhanced SOH, for example, may be used in place of previously calculated SOCs, e.g., the enhanced SOH may be used in place of the driving SOH to more accurately reflect capabilities of the battery 12 and/or the vehicle 14. The recalibration process may include determining a first range for the vehicle 14 according to the driving SOH and determining a second range for the vehicle 14 according to the enhanced SOH. The first range may a first distance the vehicle 14 is capable of driving when the battery 12 is charged to the normal SOC, and the second range representing a second distance the vehicle 14 is capable of driving when the battery 12 is charged to the normal SOC. The recalibration process may correspondingly include selecting the second range to be used instead of the first range in calculating a driving range to be communicated to an operator of the vehicle 14 due to the enhanced SOH process being more accurate than the normal SOC process as a result of the enhanced charge depth providing the greater charge depth for the battery 12 than the normal charge depth.

The terms “comprising”, “including”, and “having” are inclusive and therefore specify the presence of stated features, steps, operations, elements, or components, but do not preclude the presence or addition of one or more other features, steps, operations, elements, or components. Orders of steps, processes, and operations may be altered when possible, and additional or alternative steps may be employed. As used in this specification, the term "or" includes any one and all combinations of the associated listed items. The term "any of" is understood to include any possible combination of referenced items, including "any one of" the referenced items. "A", "an", "the", "at least one", and "one or more" are used interchangeably to indicate that at least one of the items is present. A plurality of such items may be present unless the context clearly indicates otherwise. All numerical values of parameters (e.g., of quantities or conditions), unless otherwise indicated expressly or clearly in view of the context, including the appended claims, are to be understood as being modified in all instances by the term "about" whether or not "about" actually appears before the numerical value. A component that is "configured to" perform a specified function is capable of performing the specified function without alteration, rather than merely having potential to perform the specified function after further modification. In other words, the described hardware, when expressly configured to perform the specified function, is specifically selected, created, implemented, utilized, programmed, and/or designed for the purpose of performing the specified function.

While various embodiments have been described, the description is intended to be exemplary, rather than limiting and it will be apparent to those of ordinary skill in the art that many more embodiments and implementations are possible that are within the scope of the embodiments. Any feature of any embodiment may be used in combination with or substituted for any other feature or element in any other embodiment unless specifically restricted. Accordingly, the embodiments are not to be restricted except in light of the attached claims and their equivalents. Also, various modifications and changes may be made within the scope of the attached claims. Although several modes for carrying out the many aspects of the present teachings have been described in detail, those familiar with the art to which these teachings relate will recognize various alternative aspects for practicing the present teachings that are within the scope of the appended claims. It is intended that all matter contained in the above description or shown in the accompanying drawings shall be interpreted as illustrative and exemplary of the entire range of alternative embodiments that an ordinarily skilled artisan would recognize as implied by, structurally and/or functionally equivalent to, or otherwise rendered obvious based upon the included content, and not as limited solely to those explicitly depicted and/or described embodiments.

What is claimed is:

1. A method for estimating state of health (SOH) of a battery, the battery configured for providing electrical power to a motor for use in driving a vehicle, the method comprising:

estimating a first SOH for the battery according to a first SOH process, the first SOH process including:

discharging during a first discharging operation of the battery, the battery to a first SOC corresponding to a first percentage of available energy in the battery, wherein the first discharging operation is performed by discharging electrical power from the battery to a charging station offboard the vehicle until the first SOC is reached;

charging, during a first charging operation of the battery, the battery from the first SOC to a second SOC corresponding to a second percentage of available energy in the battery, the first charging operation resulting from the charging station providing, after the first discharging operation, electrical power to the battery until the second SOC is reached, wherein the second SOC is higher than the first SOC;

determining a first charge depth to represent an amount of electrical power provided from the charging station to charge the battery from the first SOC to the second SOC; and determining the first SOH based on the first charge depth; and estimating a second SOH for the battery according to a second SOH process, the second SOH process including:

discharging, during a second discharging operation of the battery, the battery from a third SOC to a fourth SOC, wherein the third SOC corresponds to a percentage of a capacity to which the battery is charged prior to a driving operation of the vehicle, wherein the fourth SOC corresponds to an SOC of the battery after the driving operation has concluded, and wherein the second discharging operation results from the battery discharging electrical power to the motor during the driving operation;

charging, during a second charging operation of the battery, the battery from the fourth SOC to the third SOC, wherein the second charging operation results from the charging station providing electrical power to the battery until the third SOC is reached;

determining a second charge depth represent another amount of electrical power provided from the charging station to charge the battery from the fourth SOC to the third SOC; and determining the second SOH based on the second charge depth.

2. The method according to claim 1, wherein the first discharging operation and the first charging operation are performed as part of one charging cycle such that the first charging operation begins in response to completing the first discharging operation by discharging the battery to the first SOC via the charging station.

3. The method according to claim 1, wherein:

the fourth SOC is greater than the first SOC and/or the third SOC is less than the second SOC such that the first charge depth provides a greater charge depth for the battery than the second charge depth.

4. The method according to claim 3, further comprising:

determining a first range for the vehicle according to the second SOH, the first range representing a first distance the vehicle is capable of driving when the battery is charged to the third SOC via the second charging operation of the battery;

determining a second range for the vehicle according to the first SOH, the second range representing a second distance the vehicle is capable of driving when the battery is charged to the second SOC via the first SOH process; and selecting the second range to be used instead of the first range in calculating a driving range to be communicated to an operator of the vehicle, the first SOH process being more accurate than the second SOH process as result of the first charge depth providing the greater charge depth for the battery than the second charge depth.

5. The method according to claim 1, further comprising:

determining the third SOC, the fourth SOC, the first SOC, and the second SOC with a battery module, the battery module configured for interacting with the charging station to control charging and discharging of electrical power to and from the battery.

6. The method according to claim 5, further comprising: the battery module determining the third SOC, the first SOC, and the second SOC from inputs made thereto through a user interface configured for interfacing with an operator of the vehicle.

7. The method according to claim 5, further comprising: the battery module determining the third SOC, the first SOC, and the second SOC from inputs made thereto through an interface configured for interfacing with a back office device or a controller offboard the vehicle.

8. The method according to claim 5, further comprising: the battery module determining the third SOC based on a prior SOH determined for the battery before the second SOH; and the battery module determining the first SOC and the second SOC based on the second SOH.

9. The method according to claim 1, further comprising: determining the third SOC to be greater than the first SOC;

determining the fourth SOC to be equal to or greater than the first SOC; and determining the second SOC to be equal to or greater than the third SOC.

10. The method according to claim 9, further comprising: preventing the battery from discharging beyond the first SOC while performing the driving operation; and preventing the battery from charging beyond the third SOC as part of the second SOH process.

11. The method according to claim 10, further comprising:

discharging the battery beyond the fourth SOC to the first SOC as part of the first SOH process; and charging the battery beyond the third SOC to the second SOC as part of the first SOH process.

12. The method according to claim 1, further comprising: determining the second SOH and the first SOH with an SOH module, the SOH module configured for processing the second charge depth according to an SOH equation to determine the second SOH and for processing the first charge depth according to the SOH equation to determine the first SOH.

13. The method according to claim 1, further comprising: performing a scheduling process as part of the first SOH process, the scheduling process including:

estimating an amount of time needed for the first charging operation and the first discharging operation; and scheduling the first SOH process according to the amount of time.

14. The method according to claim 13, further comprising:

transmitting a request message to an owner of the vehicle or the charging station to identify a desired time of day for scheduling commencement of the first SOH process, the request message including information representing the amount of time.

15. The method according to claim 13, further comprising:

determining a pecuniary gain for discharging electrical power from the battery to the charging station;

determining a pecuniary cost for providing electrical power from the charging station to the battery; and scheduling the first SOH process according to the amount of time, the pecuniary gain, and the pecuniary cost.

16. A method for estimating state of health (SOH) of a battery, the battery configured for providing electrical power to a motor for use in driving a vehicle, the method comprising:

estimating a first SOH for the battery according to a first SOH process, the first SOH process including:

performing a first charging operation of the battery resulting from a charging station offboard the vehicle providing electrical power for charging the battery to a first state of charge (SOC), wherein the first SOC corresponds to a percentage of a capacity to which the battery is charged prior to a driving operation of the vehicle;

performing a first discharging operation of the battery resulting from the battery discharging electrical power to the motor as normal during a driving operation of the vehicle, the first discharging operation resulting in the battery discharging from the first SOC to a second SOC lower than the first SOC, wherein the second SOC corresponds to an SOC of the battery after the vehicle concludes the driving operation;

performing a first recharging operation of the battery resulting from the charging station providing electrical power for charging the battery from the second SOC to the first SOC;

determining a first charge depth to represent a first amount of electrical power provided from the charging station to charge the battery from the second SOC to the first SOC; and determining the first SOH based on the first charge depth; and estimating a second SOH for the battery according to a second SOH process, the second SOH process including:

performing a second discharging operation of the battery resulting from the battery discharging electrical power to the charging station until reaching a third SOC corresponding to a first percentage of available energy in the battery;

performing a second recharging operation of the battery resulting from the charging station providing, after the second discharging operation, electrical power for charging the battery from the third SOC to a fourth SOC corresponding to a second percentage of available energy in the battery;

determining a second charge depth to represent a second amount of electrical power provided from the charging station to charge the battery from the third SOC to the fourth SOC during the second charging operation; and determining the second SOH based on the second charge depth, wherein the first charge depth is less than the second charge depth such that the second SOH process provides a greater charge depth than the first SOH process.

17. The method according to claim 16, further comprising:

determining a range of the vehicle with a range module, the range module configured for determining the range according to the second SOH due to the greater charge depth of the second SOH process providing a more accurate calculation of the range than the first SOH.

18. The method according to claim 17, further comprising:

determining the first SOH and the second SOH with an SOH module, the SOH module configured for processing the first charge depth according to an SOH equation to determine the first SOH and for processing the second charge depth according to the SOH equation to determine the second SOH.

19. A system for estimating state of health (SOH) of a battery, the battery configured for providing electrical power to a motor for use in driving a vehicle, the system comprising:

a discharging module configured for interacting with a charging station to control a first discharging operation of the battery during a first SOH process, the first discharging operation resulting from the battery discharging electrical power to the charging station until reaching a first SOC;

a charging module configured for interacting with the charging station to control a first charging operation of the battery during the first SOH process, the first charging operation resulting from the charging station providing electrical power for charging the battery from the first SOC to a second SOC greater than the first SOC; and an SOH module configured for:

determining a first charge depth to represent an amount of electrical power provided from the charging station to charge the battery from the first SOC to the second SOC;

determining a first SOH based on the first charge depth; and estimating a second SOH according a second SOH process, the second SOH process including:

controlling, via the discharging module a second discharging operation to discharge the battery from a third SOC to a fourth SOC, wherein the second discharging operation is performed by discharging electrical power from the battery to the motor during a driving operation of the vehicle, wherein the third SOC corresponds to a percentage of a capacity to which the battery is charged prior to the driving operation and wherein the fourth SOC corresponds to an SOC of the battery after the driving operation has concluded;

controlling, via the charging module, a second charging operation to charge the battery from the fourth SOC to the third SOC, wherein the second charging operation results from the charging station providing electrical power to the battery until the third SOC is reached;

determining a second charge depth to represent another amount of electrical power provided from the charging station to charge the battery from the fourth SOC to the third SOC; and determining the second SOH based on the second charge depth.

20. The system according to claim 19, wherein:

the SOH module is configured for determining a range for the vehicle according to the first SOH, the range representing a distance the vehicle is capable of driving when the battery is charged to the second SOC.

* * * * *